United States Patent [19]

Feng et al.

[11] 4,193,821

[45] Mar. 18, 1980

[54] FABRICATION OF HETEROJUNCTION SOLAR CELLS BY IMPROVED TIN OXIDE DEPOSITION ON INSULATING LAYER

[75] Inventors: Tom Feng, Morris Plains; Amal K. Ghosh, New Providence, both of N.J.

[73] Assignee: Exxon Research & Engineering Co., Florham Park, N.J.

[21] Appl. No.: 19,827

[22] Filed: Mar. 12, 1979

Related U.S. Application Data

[63] Continuation-in-part of Ser. No. 933,563, Aug. 14, 1978, abandoned.

[51] Int. Cl.$^2$ .................. H01L 27/14; H01L 31/00; H01L 29/48
[52] U.S. Cl. ................. 148/1.5; 136/89 SG; 148/187; 357/30; 427/82; 427/110; 428/432
[58] Field of Search ................. 148/1.5, 187; 136/89 SG, 89 SJ; 357/30; 427/110, 82, 126; 428/432

[56] References Cited

U.S. PATENT DOCUMENTS

| | | | |
|---|---|---|---|
| 2,522,531 | 9/1950 | Mochel | 117/54 |
| 2,651,585 | 9/1953 | Lytle et al. | 117/54 |
| 3,004,875 | 10/1961 | Lytle | 117/211 |
| 3,647,531 | 3/1972 | Matsushita et al. | 117/211 |
| 3,949,146 | 4/1976 | Kane et al. | 428/432 |
| 3,952,323 | 4/1976 | Tanimura et al. | 357/15 |
| 3,959,565 | 5/1976 | Jordan et al. | 428/432 |
| 4,016,589 | 4/1977 | Tanimura et al. | 357/30 |

OTHER PUBLICATIONS

Franz et al., "Heterojunction Solar Cells of SnO$_2$/Si", J. Electron. Materials, 6 (1977) 107.
Anderson, R. L., "Heterojunction Solar Cells" Report: NSF/RANN/SE/AER67-04168/PR/77/1,2, p. 1, 1977.

*Primary Examiner*—L. Dewayne Rutledge
*Assistant Examiner*—Upendra Roy
*Attorney, Agent, or Firm*—Joseph J. Dvorak

[57] ABSTRACT

Highly efficient tin oxide-silicon heterojunction solar cells are prepared by heating a silicon substrate, having an insulating layer thereon, to provide a substrate temperature in the range of about 300° C. to about 400° C. and thereafter spraying the so-heated substrate with a solution of tin tetrachloride in a organic ester boiling below about 250° C. Preferably the insulating layer is naturally grown silicon oxide layer.

12 Claims, 1 Drawing Figure

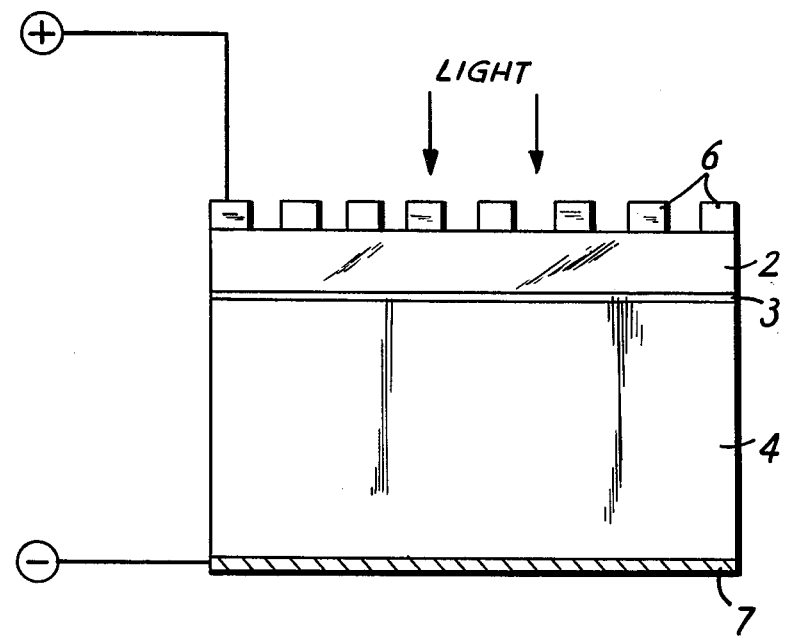

FABRICATION OF HETEROJUNCTION SOLAR CELLS BY IMPROVED TIN OXIDE DEPOSITION ON INSULATING LAYER

The Government of the United States of America has rights in this invention pursuant to Department of Energy Contract No. EY-76-C-03-1283.

CROSS-REFERENCE TO RELATED APPLICATIONS

This application is a continuation-in-part of Ser. No. 933,563, filed Aug. 14, 1978, now abandoned.

BACKGROUND OF THE INVENTION

1. Field of the Invention

This invention relates generally to the fabrication of tin oxide semiconductor heterojunction devices. More particularly, the present invention relates to a method for consistently preparing high efficiency tin oxide semiconductor heterojunction solar cells by the hydrolysis on the surface of an N-type semiconductor of a vapor deposited solution of a tin compound.

2. Prior Art

There has been considerable interest in recent years directed toward the development of semiconductive heterojunction devices comprising an electrically conductive transparent window material deposited on the semiconductor substrate. Such interest is based on the potential that such devices can be fabricated at lower cost than homojunction devices based on the conventional diffusion of N and/or P materials into the semiconductor substrate. Additionally, heterojunction conducting oxide devices offer the added advantage that the transparent window permits the transmission of solar radiation directly to the active substrate with little or no attenuation. One such type of heterojunction solar cell proposed is a tin oxide semiconductor heterostructure solar cell, especially a tin oxide silicon heterostructure solar cell.

Transparent conductive tin oxide coatings on semiconductive substrates such as silicon have been formed by electron beam techniques (see, for example, Journal of Electronic Materials, Vol. 6, No. 2, pp. 107–123 (1977); and Report NSF/RANN/SE/AER67-04168/PR/77/1,2 (1977)) and by what is broadly characterized herein as chemical vapor deposition techniques (see, for example, Japan Journal of Applied Physics, 6, p. 905 (1967); U.S. Pat. Nos. 3,210,214; 3,679,949 and 3,952,323).

In general, none of the foregoing techniques have consistently resulted in heterostructure solar cells having high sunlight conversion efficiencies; however, from an economic and commercial point of view, a process for the fabrication of tin oxide-semiconductor heterostructure solar cells via vapor deposition techniques would be most desirable.

As will be appreciated, in the vapor deposition of transparent conductive tin oxide coatings, volatile compounds of tin are employed which are either hydrolyzed, oxidized, reduced or decomposed on a heated substrate. For a recent review of preparative techniques for depositing tin oxide films, see Journal of the Electrochemical Society, 123, No. 7, 199C–205C (1976). As is indicated in the just-mentioned reference, the most common and promising method of depositing tin oxide films depends upon the hydrolysis of inorganic tin halide compounds on the surface of a heated substrate. Typically a compound such as stannic chloride is dissolved in a solvent such as an alcohol, acetic acid or a mixture of the two, and the solution is sprayed, in air, onto the surface of the preheated substrate where the stannic chloride is hydrolyzed to form tin oxide. The solvent is used to modify the otherwise rapid conversion of the tin halide to tin oxide (see, for example, Australian Journal of Applied Science, 5, 10–17 (1954)).

One difficulty with tin oxide coatings deposited by such prior art techniques is the resultant low conductivity of the coatings; and hence the need to admix antimony trichloride or other dopants with the tin compound being vaporized, since the dopant apparently increases the electrical conductivity of the tin oxide coatings formed therewith. A similar requirement is disclosed in U.S. Pat. No. 3,679,949 wherein a conductive transparent coating of tin oxide is deposited on a semiconductive substrate by oxidizing a halogenated organic tin compound, preferably in admixture with $SbCl_3$, on the heated semiconductor substrate. Nonetheless, tin oxide-silicon solar cells prepared by such techniques exhibit relatively low sunlight engineering efficiencies.

Thus, although it is well known that tin oxide semiconductor heterojunction devices can be formed by vapor deposition of tin oxide on the semiconductive substrate, there remains a need for a simple method of fabricating devices that will have high sunlight conversion efficiencies.

SUMMARY OF THE INVENTION

Briefly stated, it has been discovered that highly efficient tin oxide-semiconductive heterojunction solar cells, i.e. cells having sunlight conversion efficiencies of greater than about 10% when measured in AM1 spectrum of 100 mw/cm$^2$, can be prepared in a simple and inexpensive manner by atomizing a liquid solution of tin tetrachloride in certain organic compounds and contacting the atomized liquid solution with a semiconductive substrate that is first heated to provide a substrate surface temperature in the range of about 300° C. to about 400° C. Contacting the atomized solution with the substrate is continued. Heating of the substrate is continued during the contacting period for a time sufficient to deposit a coating of tin oxide on the surface of the semiconductive substrate.

BRIEF DESCRIPTION OF THE DRAWING

The invention will be further described with reference to the drawing which is a general block diagram of a side view of a heterojunction solar cell according to this invention.

DETAILED DESCRIPTION OF THE INVENTION

Referring now to the FIGURE, a solar cell of this invention has an N-type transparent conductive tin oxide layer 2 disposed on an N-type silicon semiconductive substrate 4. The thickness of the tin oxide 2 is from about 300 Angstroms to about 5,000 Angstroms, and preferably about 500 Angstroms to about 2,000 Angstroms. The cell additionally has a metal front contact with fingers 6 and a back metal electrode 7 deposited thereon by well-known techniques. Interposed between the silicon semiconductive substrate 4 and the tin oxide layer 2 is an insulating material 3.

In the practice of the present invention, it is particularly preferred that the N-type silicon have a resistivity generally below about 10 ohm-cm and especially in the range of about 0.2 to 3 ohm-cm and even lower.

The insulating film 3 is selected from the group consisting of $SiO_2$, $Si_3N_4$, $GeO_2$, $Al_2O_3$ or $TiO_2$. Preferably the insulating film is an oxide of silicon. In general, the interfacial insulating layer 3 should be less than about 30 Angstroms in thickness. Indeed, it is particularly preferred that the oxide be $SiO_2$ which naturally forms on the surface of the silicon substrate. As is well known, when manufacturing silicon substrates for semiconductor devices a thin oxide film forms on the surface of the silicon substrate under normal temperature conditions. This silicon oxide typically is of a thickness of a few Angstroms to about 15 Angstroms. For example, it has been found that when preparing tin oxide silicon heterojunction solar cells in accordance with the method of the present invention, the presence of a "naturally grown" oxide layer having, for example, a thickness in the range from about 10 to 30 Angstroms improves the open circuit voltage and efficiency of the cell. Thus, when tin oxide was deposited according to the present invention on silicon which was first cleaned in concentrated hydrofluoric acid in order to remove the "naturally grown" oxide, the resultant cell had an open circuit voltage at irradiances greater than one sun of 0.58 volts. In contrast thereto, when the tin oxide was deposited on a silicon wafer, which after cleaning with HF was heated in air for 30 seconds at 600° C. to oxidize the silicon surface, the open-circuit voltage of the resultant cell was 0.67 volts.

As is indicated, the oxide layer can be grown, for example, by heating the silicon in air at elevated temperature or by depositing on the silicon substrate one or more of the above-mentioned insulating materials by well-known techniques. However, in most instances, a "naturally-grown" oxide layer is of sufficient thickness and preferred. It is worth noting in this regard that U.S. Pat. No. 3,952,323 discloses the importance of an insulating film in tin oxide-semiconductor heterojunction devices but that naturally formed insulating films are considered by the patentee generally to be disadvantageous.

As indicated briefly above, in the process of the present invention tin oxide coatings are deposited on semiconductive substrates by first atomizing solutions of tin tetrachloride dissolved in certain organic compounds. These organic solvents are selected from organic esters having boiling points generally below about 250° C. A representative list of suitable esters that can be used as a solvent for the tin tetrachloride according to this invention is given in Table I below:

TABLE I

| Ester | Boiling Point, °C. |
|---|---|
| methyl formate | 32 |
| ethyl formate | 54 |
| methyl acetate | 57 |
| ethyl acetate | 77.1 |
| n-propyl acetate | 101.7 |
| n-butyl acetate | 126.5 |
| n-amyl acetate | 147.6 |
| isobutyl acetate | 118 |
| tertiary butyl acetate | 97 |
| iso-amyl acetate | 142 |
| n-octyl acetate | 210 |
| methyl propionate | 79.7 |
| ethyl n-propionate | 99.1 |
| methyl n-butyrate | 102.3 |
| ethyl n-butyrate | 121 |
| iso-amyl n-butyrate | 178.6 |
| methyl n-valarate | 127.3 |

TABLE I-continued

| Ester | Boiling Point, °C. |
|---|---|
| ethyl n-valarate | 145.5 |
| ethyl n-heptylate | 187 |

In the practice of the present invention, it is particularly preferred that the ester be selected from the group consisting of n-amyl acetate, ethyl acetate, and n-butyl acetate. The amount of ester employed is generally sufficient to dissolve the tin tetrachloride. It is particularly preferred that solutions of the order of 0.2 to 2 molar be employed.

In atomizing the liquid solution, any well-known atomizing device may be used. For example, hydraulic, pneumatic or vibrational atomizing devices may be used to provide a spray or mist of the liquid solution of tin tetrachloride. It is particularly preferred in the practice of the present invention to use a pneumatic spraying device, in which the gas used to atomize the liquid solution is air. It should be appreciated, however, that other carrier gases such as nitrogen and the like, and even oxygen, may be employed.

As is well known, spray guns typically subdivide liquid solutions into droplets having diameters generally in the range of about 100 to 1,000 microns whereas misting devices generate or subdivide liquid solutions into droplets having diameters in the range of about 10 to 100 microns. While the size of the droplets produced during atomization of the tin tetrachloride in the organic solvent is not critical, it is desirable that the droplets be generally below 1,000 microns in diameter. As indicated above, conventional liquid spray devices will produce such an atomized stream of the liquid solution.

The substrate to be coated by the atomized liquid solution is first heated to provide a substrate surface temperature of from about 300° C. to 400° C. and preferably from about 330° C. to about 360° C. Suitable conductive tin oxide coatings are not readily developed from solution when the substrate surface is at lower temperatures. Indeed, the rate of reaction is inefficient at too low a temperature. At very high temperatures, too, the cell efficiency is detrimentally affected.

The substrate surface temperature can be determined by means of a surface probe such as a Digital Temperature Indicator, Model 64-06-02 sold by Watlow Corporation, Winona, Minn. Reference is made to the substrate surface temperature herein since there can be a significant difference in the temperature of the substrate and the furnace employed for heating the substrate. For example, it was found that the surface temperature of a silicon substrate heated by a graphite vacuum chuck only reached 340° C. when the chuck was heated to 400° C.

It is not necessary, of course, to constantly monitor the substrate surface temperature once the relationship between surface temperature and furnace temperature is established. Nonetheless reference to substrate surface temperature is made herein to assure reproducibility of the results obtained.

Once the substrate surface is at the desired temperature, contacting the substrate with the requisite tin tetrachloride solution is initiated with continued heating of the substrate.

The time required for deposition of the tin oxide coating on the heated substrate is generally less than two minutes and typically is of the order of about 50 seconds. As should be readily appreciated, however, the time required for deposition of an adequate layer of tin oxide, e.g., from 300 to 5,000 Angstroms thick and preferably 500 to 2,000 Angstroms thick, will depend upon the concentration of the solution, the flow rate of solution and the temperatures of the substrate. As a nonlimiting example, 0.77 molar solution of tin tetrachloride and ethyl acetate was sprayed for 60 seconds at a solution flow rate of 5 cc per minute and an air flow rate of 24.6 liters/minute at 200 Kpa on a silicon substrate heated by a graphite vacuum chuck maintained at 420° C. provided a tin oxide of approximately 1,000 Angstroms thickness on the silicon substrate.

After deposition of the tin oxide, the coated semiconductor substrate was provided with appropriate electrodes. For example, effective metallization is accomplished by standard techniques such as vacuum evaporation of titanium followed by silver to provide a total metallization of 6,000 Angstroms or more in thickness. Typically, the titanium layer is approximately 1,000 Angstroms thick. Front contact metallization is also done by the same standard techniques, except that a suitable mask with multiple patterns is employed and the metallized device is then scribed into a plurality of individual cells.

EXAMPLE 1

Following the general procedures outlined hereinabove, a series of tin oxide-silicon solar cells were made and the sunlight power conversion efficiencies were measured in AM1 spectrum of 100 mw/cm$^2$ using a xenon arc lamp solar simulator. In each of these tests, single crystal silicon wafers were used having the following general characteristics:

Type: N-type (phosphorus)
Resistivity: 3 ohm-cm and less
Orientation: (100)
Thickness: 10–11 mils
Front Surface: Polished
Back Surface: Plain Except where noted, the silicon had an oxide on the surface grown "naturally" at room temperature, generally of the order of below about 30 Angstroms in thickness. Hence, the wafer typically was used as received.

The silicon wafer with the polished side facing up was placed on a graphite vacuum chuck. This graphite vacuum chuck was heated by three cartridge heaters embedded in the graphite. The temperature of the chuck was controlled by means of a temperature controller. As indicated previously there is a temperature differential between the silicon substrate surface and the vacuum chuck. Maintaining the chuck, for example, at 400° C. was found by a temperature probe to provide a silicon substrate surface temperature prior to spraying of 340° C.

For all runs, the anhydrous purified tin tetrachloride and anhydrous reagent grade esters were employed. The solutions were atomized by means of a Binks pneumatic spray nozzle (Model No. 50-175). The distance from the nozzle to the silicon surface was 29.5 cm. The flow rates and reaction conditions are listed in Table II below.

After deposition of the tin oxide film, the back surface of the semiconductor was lapped with a 400 grid polishing paper and then placed in a high vacuum evaporator. After pumping down to a pressure of $10^{-6}$ to $10^{-7}$ torr, 1,000 Angstroms of titanium and 5,000 Angstroms of silver were sequentially deposited by an electron beam. The structure was then removed from the vacuum chamber and the tin oxide film was placed in intimate contact with a metal evaporation mask with multiple patterns. This assembly was then placed in an evacuation chamber and pumped down to a vacuum of $10^{-6}$ to $10^{-7}$ torr and, again, 1,000 Angstroms of titanium and 10,000 Angstroms of silver were sequentially evaporated through the mask onto the tin oxide film. Subsequently after removing from the vacuum chamber, the wafer was scribed into individual cells with both 1 and 4 cm$^2$ sizes of the type shown generally in the FIGURE. Thereafter, the short circuit photocurrent, open circuit photovoltage and engineering efficiencies were determined for typical cells. Specific details and the results of such evaluations for typical cells are given in Table II below.

TABLE II

|  | Run 1 | Run 2 | Run 3 | Run 4 |
| --- | --- | --- | --- | --- |
| Substrate Resistivity, ohm/cm | .2–.4 | 1–3 | 0.6–0.7 | 0.2–0.4 |
| Chuck Temp., °C. | 420 | 420 | 400 | 400 |
| SnCl$_4$ Solution |  |  |  |  |
| Ester | ethyl acetate | ethyl acetate | n-amyl acetate | ethyl acetate |
| Molarity | 0.77 | 0.77 | 0.77 | 0.77 |
| Flow Rate Solution | 5 cc/min | 5 cc/min | 5 cc/min | 5 cc/min |
| Flow Rate |  |  |  |  |
| Air pressure, Kpa | 200 | 200 | 200 | 200 |
| Flow rate, air | 24.6 l/min | 24.6 l/min | 24.6 l/min | 24.6 l/min |
| Deposition time, sec. | 60 | 60 | 60 | 50 |
| Open circuit voltage | 0.615 V | 0.577 V | 0.60 V | 0.62 V |
| Short Circuit Photocurrent | 29.1 mA/cm$^2$ | 28.1 mA/cm$^2$ | 29.8 mA/cm$^2$ | 29.5 mA/cm$^2$ |
| Sunlight Engineering Efficiency | 12.24% | 11.04% | 11.93% | 12.25% |

What is claimed is:

1. A process for forming a tin oxide semiconductor heterojunction solar cell comprising:
   providing an N-type silicon substrate having a resistivity less than about 10 ohm-cm;
   depositing an insulating layer on the surface of said silicon substrate, said insulating layer being selected from the group consisting of SiO$_2$, Si$_3$N$_4$, GeO$_2$, Al$_2$O$_3$ and TiO$_2$;
   heating said substrate to provide a substrate surface temperature in the range of about 300° C. to about 400° C.; and
   contacting said heated substrate in the presence of air with an atomized liquid solution of tin tetrachloride and an organic ester having a boiling point below about 250° C. while continuing said heating, said contacting being for a time sufficient to deposit a conductive coating of tin oxide on the substrate.

2. The process of claim 1 wherein the insulating layer is less than 30 Angstroms in thickness.

3. The process of claim 2 wherein the insulating layer is $SiO_2$.

4. The process of claim 3 wherein said N-type silicon substrate is heated to provide a surface temperature in the range of about 330° C. to about 360° C.

5. The process of claim 2 wherein said silicon has an insulating layer on the surface thereof ranging in thickness from about 10 Angstroms to about 30 Angstroms.

6. The process of claim 1 wherein said organic ester is selected from ethyl acetate, butyl acetate, amyl acetate, propyl acetate and wherein said tin tetrachloride is present in said organic ester in amounts ranging from about 0.2 to 2 moles/liter.

7. The process of claim 6 wherein said atomizing of said liquid solution is done by pneumatic spraying.

8. The process of claim 6 wherein said atomizing of said liquid solution is done by vibrational spraying.

9. A process for forming a tin oxide-silicon heterojunction solar cell having a sunlight efficiency greater than about 10% which comprises:
   (1) providing an N-type silicon substrate having a resistivity less than about 3 ohm-cm and having a silicon oxide layer on the surface thereof ranging from about 10 Angstroms to about 30 Angstroms in thickness;
   (2) heating said N-type silicon substrate, in air, to provide a substrate surface temperature of from about 300° C. to about 400° C.;
   (3) continuing said heating while simultaneously spraying a solution of tin tetrachloride in an organic ester onto said substrate, said organic ester being selected from the group consisting of ethyl acetate, n-butyl acetate, n-propyl acetate, and n-amyl acetate, said spraying being conducted for a time sufficient to deposit the coating of tin oxide on said silicon substrate;
   (4) depositing a metal electrode on said tin oxide layer; and
   (5) depositing a metal electrode on said silicon layer whereby a tin oxide heterojunction device is provided.

10. The process of claim 9 wherein said silicon substrate is heated to provide a substrate surface temperature from about 330° C. to about 360° C. and said tin tetrachloride in said organic ester ranges from about 0.2 to 2.0 moles/liter.

11. The process of claim 10 wherein said organic ester is ethyl acetate.

12. A process for forming a tin oxide-silicon heterojunction solar cell having a sunlight efficiency greater than about 10% which comprises:
   (1) providing an N-type silicon substrate having a resistivity less than about 3 ohm-cm and having a silicon oxide layer on the surface thereof ranging from about 10 Angstroms to about 30 Angstroms in thickness;
   (2) heating said N-type silicon substrate, in air, to provide a substrate surface temperature of from about 300° C. to about 400° C.;
   (3) continuing said heating while simultaneously spraying a solution of from about 0.2 to about 2.0 moles/liter of tin tetrachloride in an organic ester selected from the group consisting of ethyl acetate, n-propyl acetate, n-butyl acetate and n-amyl acetate, said spraying being conducted for a time sufficient to deposit a layer of tin oxide ranging from about 500 Angstroms to about 2,000 Angstroms in thickness on the silicon substrate;
   (4) depositing a metal electrode on said tin oxide layer; and
   (5) depositing a metal electrode on said silicon layer whereby a tin oxide heterojunction device is provided.

* * * * *